(12) United States Patent
Hara et al.

(10) Patent No.: US 8,951,908 B2
(45) Date of Patent: Feb. 10, 2015

(54) METHOD FOR MANUFACTURING SEMICONDUCTOR DEVICE

(71) Applicant: Tokyo Electron Limited, Minato-ku (JP)

(72) Inventors: Kenichi Hara, Tsukuba (JP); Takashi Hayakawa, Minato-ku (JP); Mariko Ozawa, Minato-ku (JP)

(73) Assignee: Tokyo Electron Limited, Minato-ku (JP)

( * ) Notice: Subject to any disclaimer, the term of this patent is extended or adjusted under 35 U.S.C. 154(b) by 0 days.

(21) Appl. No.: 14/221,711

(22) Filed: Mar. 21, 2014

(65) Prior Publication Data

US 2014/0206187 A1 Jul. 24, 2014

Related U.S. Application Data

(63) Continuation of application No. PCT/JP2012/070661, filed on Aug. 14, 2012.

(30) Foreign Application Priority Data

Sep. 21, 2011 (JP) ................. 2011-205555

(51) Int. Cl.
*H01L 21/768* (2006.01)
*H01L 23/532* (2006.01)
*H01L 21/321* (2006.01)
*H01L 21/3213* (2006.01)

(52) U.S. Cl.
CPC .... *H01L 21/76843* (2013.01); *H01L 23/53238* (2013.01); *H01L 21/76883* (2013.01); *H01L 21/76834* (2013.01); *H01L 21/3212* (2013.01); *H01L 21/32136* (2013.01)
USPC ........... 438/629; 438/642; 438/692; 438/700; 438/653; 438/637; 257/E21.585

(58) Field of Classification Search
USPC ......... 438/618, 622, 625, 629, 631, 633, 666, 438/652–656, 672, 675, 689–692, 700–707
See application file for complete search history.

(56) References Cited

U.S. PATENT DOCUMENTS

| 7,709,344 | B2 * | 5/2010 | Chen et al. ..................... 438/401 |
| 7,772,110 | B2 * | 8/2010 | Robison et al. ............... 438/627 |
| 2010/0248473 | A1 * | 9/2010 | Ishizaka et al. ............... 438/659 |
| 2013/0075248 | A1 * | 3/2013 | Hara et al. ............... 204/192.34 |

FOREIGN PATENT DOCUMENTS

| JP | 2001-210630 | 8/2001 |
| JP | 2004-200684 | 7/2004 |
| JP | 2006-120664 | 5/2006 |
| JP | 2009-043975 | 2/2009 |
| JP | 2010-027788 | 2/2010 |

OTHER PUBLICATIONS

International Search Report mailed Nov. 20, 2012 in PCT/JP2012/070661, filed Aug. 14, 2012 (with English Translation).

* cited by examiner

*Primary Examiner* — Savitr Mulpuri
(74) *Attorney, Agent, or Firm* — Oblon, Spivak, McClelland, Maier & Neustadt, L.L.P.

(57) ABSTRACT

A method for manufacturing semiconductor device includes preparing a structure including a substrate, an insulating layer on the substrate and having a recess, a barrier film on the insulating layer, and a copper film on the barrier such that the copper film is filling the recess with the barrier between the insulating layer and copper film, removing the copper film down to interface with the barrier such that copper wiring is formed in the recess, etching the wiring such that surface of the wiring is recessed from surface of the insulating layer, and removing the barrier from the surface of the insulating layer such that the surface of the insulating layer is exposed. The etching includes positioning the structure removed down to the barrier in organic compound atmosphere having vacuum state, and irradiating oxygen gas cluster ion beam on the surface of the wiring to anisotropically etch the wiring.

19 Claims, 4 Drawing Sheets

METHOD FOR MANUFACTURING SEMICONDUCTOR DEVICE

CROSS REFERENCE TO RELATED APPLICATIONS

The present application is a continuation of PCT/JP2012/070661, filed Aug. 14, 2012, which is based upon and claims the benefit of priority to Japanese Application No. 2011-205555, filed Sep. 21, 2011. The entire contents of these applications are incorporated herein by reference.

BACKGROUND OF THE INVENTION

1. Field of the Invention

The present invention relates to a method for manufacturing a semiconductor device.

2. Description of Background Art

In a structure where surfaces of adjacent Cu wiring lines and the surface of an interlayer insulating layer positioned between them are on substantially the same plane, a leak current flows on the interface between adjacent insulators, causing electromigration of copper atoms that accompanies such a leak current. Subsequently, short-circuiting occurs between wiring lines.

As a technique for preventing short-circuiting among copper wiring lines, there is a Cu recessing process in which Cu wiring lines are etched so that their surfaces are recessed from the surface of the interlayer insulating layer. Such Cu recessing processes includes a wet-etching method and a dry-etching method such as plasma etching using a CF-based gas. However, dry etching is not practical because it involves complex steps that include wet etching to remove by-products deposited after the dry etching. Thus, more attention has been placed on wet etching (see JP 2001-210630 A). The entire contents of this publication are incorporated herein by reference.

SUMMARY OF THE INVENTION

According to one aspect of the present invention, a method for manufacturing a semiconductor device includes preparing a structure including a substrate, an interlayer insulating layer formed on the substrate and having a recessed portion, a barrier film formed on the interlayer insulating layer, and a copper film formed on the barrier film such that the copper film is filling the recessed portion of the interlayer insulating layer with the barrier film interposed between the interlayer insulating layer and the copper film, removing the copper film of the structure by chemical mechanical polishing down to an interface with the barrier film such that a copper wiring is formed in the recessed portion of the interlayer insulating layer, etching the copper wiring such that a surface of the copper wiring is recessed from a surface of the interlayer insulating layer, and removing the barrier film by chemical mechanical polishing from the surface of the interlayer insulating layer such that the surface of the interlayer insulating layer is exposed. The etching of the copper wiring includes positioning in an organic compound atmosphere having a vacuum state and including an organic compound the structure removed down to the barrier film, and irradiating an oxygen gas cluster ion beam on the surface of the copper wiring of the structure such that the copper wiring is anisotropically etched.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1:
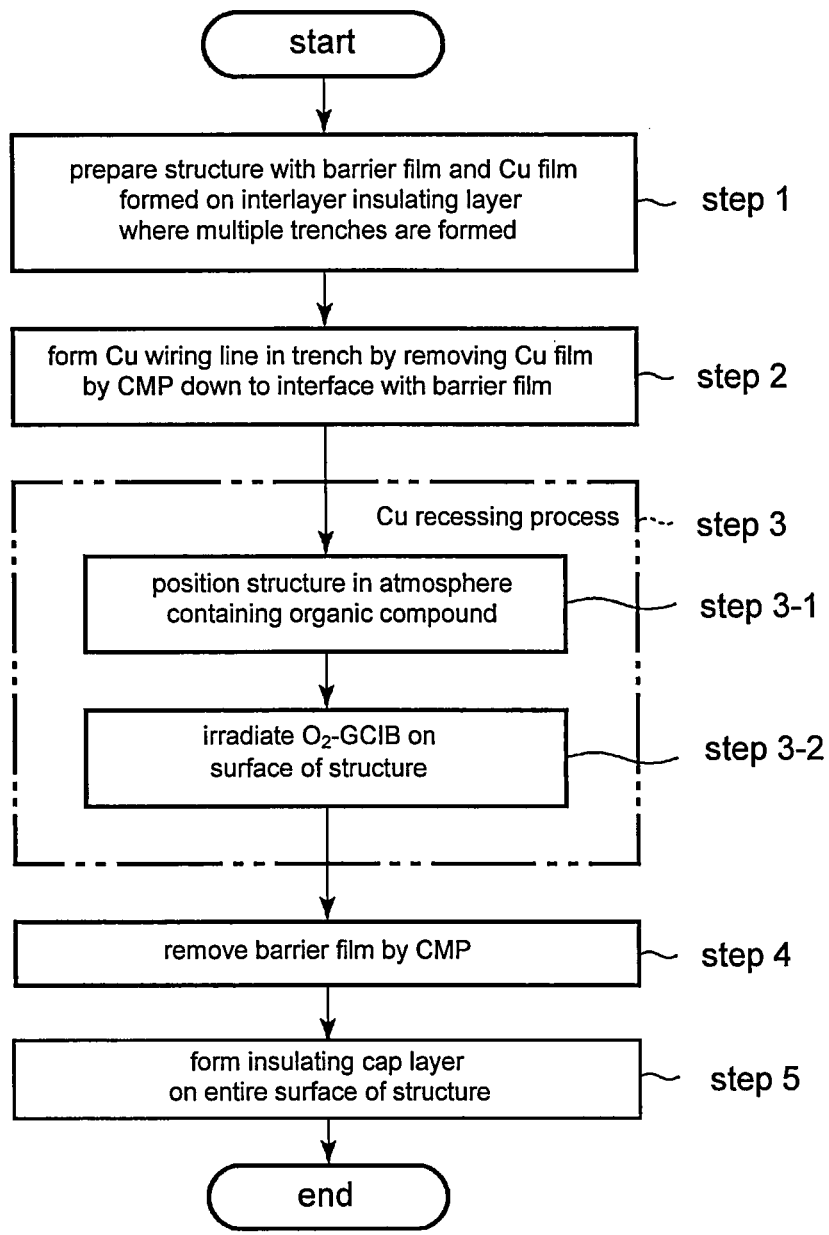
FIG. 1 is a flowchart illustrating a method for manufacturing a semiconductor device according to an embodiment of the present invention.

The embodiments will now be described with reference to the accompanying drawings, wherein like reference numerals designate corresponding or identical elements throughout the various drawings.

FIG. 1 is a flowchart illustrating a method for manufacturing a semiconductor device according to an embodiment of the present invention, and FIG. 2 shows cross-sectional views of processing steps to illustrate the method.

First, on semiconductor substrate 10 made of silicon or the like, etching stopper film 11 made of SiC or the like, a Low-k film made of TEOS or the like, and interlayer insulating layer 12 made of $SiO_2$ or the like are all formed. Then, using a mask material patterned by photolithography, dry etching is conducted to form trenches 13, which are recessed portions into which copper wiring lines are embedded. Next, after barrier film 14 is formed on the entire surface including the inside of trenches 13, copper (Cu) layer 15 is formed by Cu plating, for example. Accordingly, a structure (substrate) is prepared in which Cu is embedded in multiple trenches 13 to form wiring lines (step 1, FIG. 2(a)). As barrier film 14, Ta, TaN or a laminated film of Ta/TaN is preferably used. In addition, the surface of Cu film 15 is set to be higher than the upper edges of trenches 13.

Next, chemical mechanical polishing (CMP) is conducted until Cu film 15 is removed down to the interface with barrier film 14. Accordingly, Cu wiring lines are formed by retaining Cu only in the trenches (step 2, FIG. 2(b)). The upper surfaces of Cu wiring lines 16 in trenches 13 are positioned at substantially the same height as the exposed surface of barrier film 14.

Figure 3A:
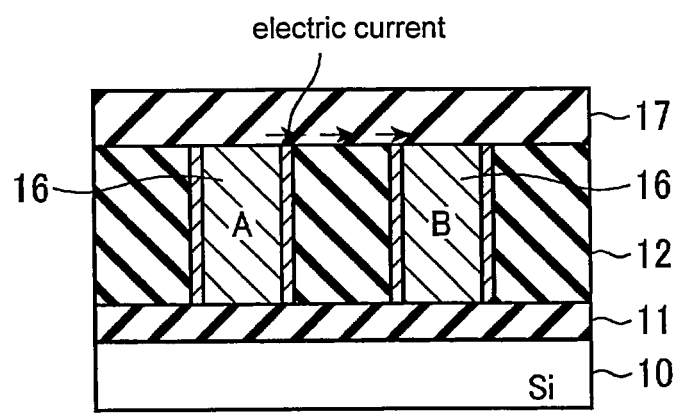
FIG. 3A is a view illustrating electromigration of Cu atoms when a Cu recessing process is not conducted.
Figure 3B:
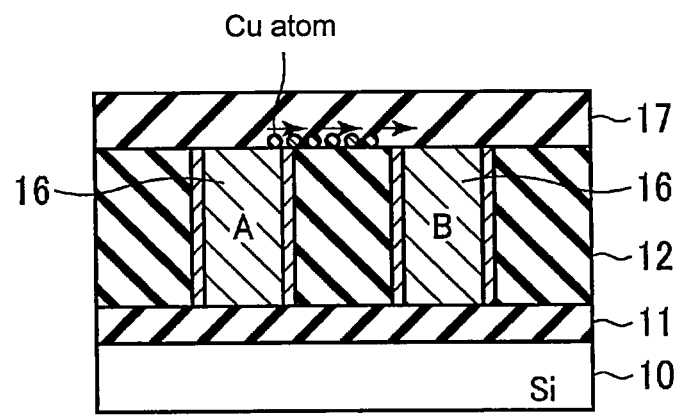
FIG. 3B is a view illustrating electromigration of Cu atoms when a Cu recessing process is not conducted.

After the above, as shown in FIG. 3A, if CMP is further conducted to remove barrier film 14, and insulating cap layer 17 is formed on the entire surface, surfaces of Cu wiring lines 16 are positioned on substantially the same plane with the surface of interlayer insulating layer 12. Accordingly, a leak current flows on the interface between interlayer insulating layer 12 and insulating cap layer 17, causing electromigration of Cu atoms that accompany the leak current. Subsequently, short-circuiting occurs between Cu wiring lines 16, as shown in FIG. 3B.

In the following, a detailed description is provided.

When one of the adjacent Cu wiring lines 16 is referred to as (A) and the other as (B), bias is applied between wiring line (A) and wiring line (B). Although treatment for preventing a leak current is conducted between interlayer insulating layer 12 and insulating cap layer 17, a leak current is more likely to flow there than in bulk portions. There is an intense electric field in portions where the distance between wiring lines is short, and an especially intense electric field is observed at wiring-line corners. Therefore, a leak current from a corner of wiring line (A) flows to wiring line (B) through the interface between interlayer insulating layer 12 and insulating cap layer 17. Such a leak current causes an electromigration phenomenon, and Cu atoms in the corner of wiring line (A) are distributed to the interface between interlayer insulating layer 12 and insulating cap layer 17. Since Cu allows an electric current to flow, a virtual distance between wiring lines narrows, causing the leak current to gradually increase. Accordingly, Cu atoms are distributed more onto the interface, resulting in short-circuiting between wiring line (A) and wiring line (B).

In an embodiment of the present invention, after CMP is conducted on Cu film 15, a Cu recessing process is performed on Cu wiring lines 16 in trenches 13 through etching so that Cu surfaces will be recessed from the surface of interlayer insulating layer 12 (step 3). By performing the Cu recessing process, Cu atoms are removed from wiring corners where electric-field concentration tends to be observed. Accordingly, electromigration of Cu atoms does not occur even when a leak current is generated.

Cu is hard to etch through dry etching using a normal CF-based gas. Even if dry etching is employed, its procedure is complex and by-products deposited after the dry etching are required to be removed through wet etching. Thus, the Cu recessing process was conventionally conducted by wet etching.

However, since wet etching uses $HF+H_2O_2$, $HNO_3$, $H_2SO_4$ or the like as a chemical solution, problems arise such as defective Cu surfaces due to etching, and deeper roughened surfaces due to greater etching rates on grain boundaries. Also, further problems may arise from spike etching, which results in microslits formed on the Cu/Ta interface when galvanic corrosion occurs at the Cu/Ta interface between Cu and a Ta barrier film, causing Cu to dissolve as Cu electrons are pulled out by Ta. As a result of such spike etching, the adhered area of the Cu/Ta interface decreases, and the microslits become the starting points of electromigration that derives from a current flowing through wiring lines. Subsequently, wiring-line breakage may occur.

In an embodiment of the present invention, the Cu recessing process in step 3 is conducted in a totally new dry process as described below.

Figure 2A:
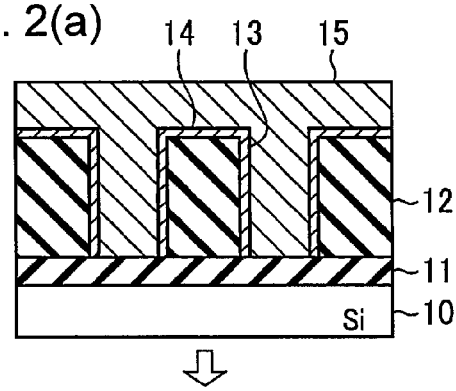
FIGS. 2(a)-2(g) are cross-sectional views of processing steps illustrating a method for manufacturing a semiconductor device according to an embodiment of the present invention.
Figure 2B:
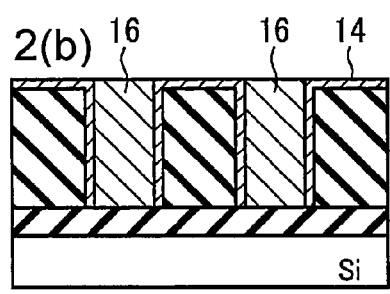
Figure 2C:
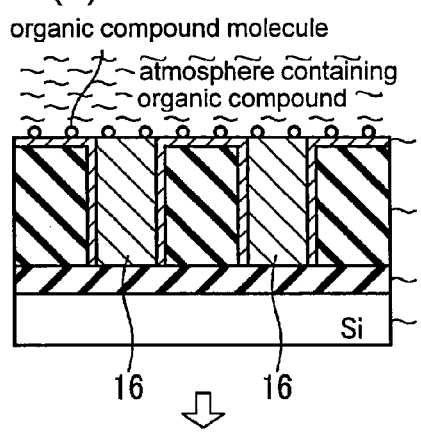
Figure 2D:
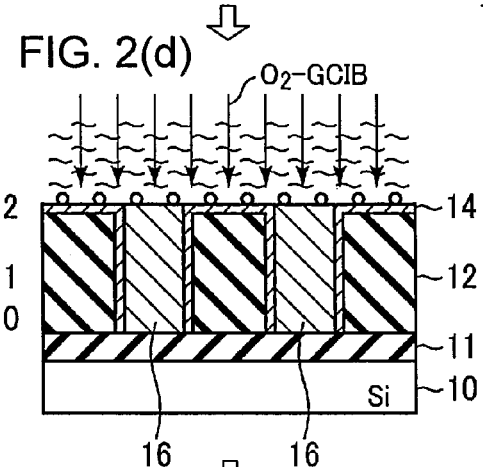

Namely, the structure in FIG. 2(b) is loaded into a chamber (not shown) of an etching apparatus, where the atmosphere in the chamber is set to be highly vacuum state. Then, an organic compound such as acetic acid is supplied to create organic compound atmosphere (step 3-1, FIG. 2(c)), while an $O_2$ gas cluster ion beam ($O_2$-GCIB) is irradiated on the surface of the structure (step 3-2, FIG. 2(d)). Accordingly, Cu is oxidized to form copper oxide, which then reacts with the organic compound, thereby etching Cu wiring lines 16. At that time, the above structure (substrate) is scanned by a driver device, for example, so that the entire substrate surface will be irradiated by the $O_2$-GCIB.

An $O_2$-GCIB is formed as follows: while adjusting the pressure, $O_2$ gas molecules are injected from a nozzle to form an $O_2$ cluster flow in which a few to tens of thousands of $O_2$ molecules are agglomerated by Van der Waals attraction; and the $O_2$ cluster flow is ionized by an ionizer and accelerated by an accelerator. Namely, an $O_2$-GCIB is formed when $O_2$ clusters are ionized to form $O_2$ gas cluster ions ($O_2$-GCI), which are then put into a beam. An apparatus to form a GCIB is described in detail in published US patent application 2006/0105570. The entire contents of this publication are incorporated herein by reference.

By referring to FIG. 4, a description is provided below for the mechanism and effects of a Cu recessing process by dry etching in step 3.

Figure 4A:
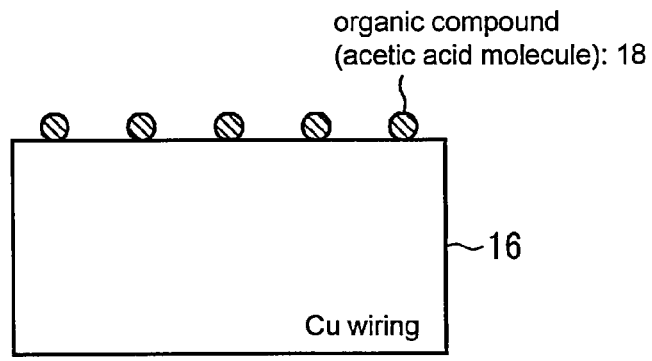
FIG. 4A is a view illustrating the mechanism and effects of a Cu recessing process in a method for manufacturing a semiconductor device according to an embodiment of the present invention.
Figure 4B:
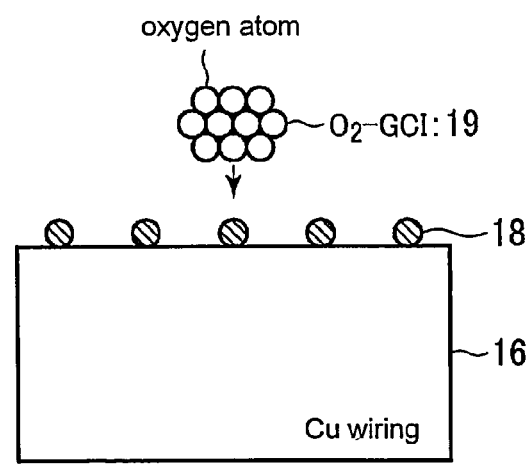
FIG. 4B is a view illustrating the mechanism and effects of a Cu recessing process in a method for manufacturing a semiconductor device according to an embodiment of the present invention.
Figure 4C:
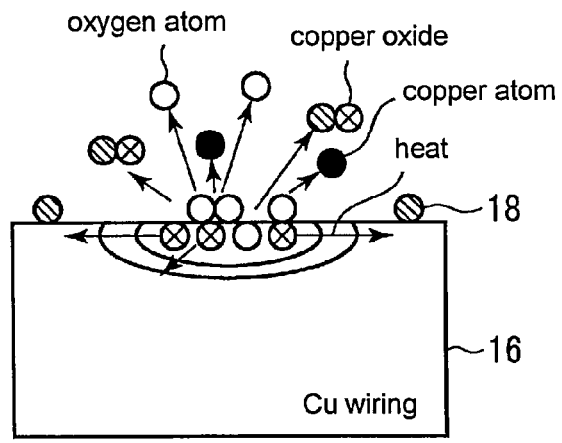
FIG. 4C is a view illustrating the mechanism and effects of a Cu recessing process in a method for manufacturing a semiconductor device according to an embodiment of the present invention.

According to an embodiment of the present invention, since a Cu recessing process is conducted using the heat generated by the collision involving an $O_2$-GCIB, the structure (substrate) is not heated but is retained at room temperature. Thus, as shown in FIG. 4A, a sufficient amount of molecules 18 (acetic acid molecules) of an organic compound are adsorbed on the entire surface of the structure including surfaces of Cu wiring lines 16. When an $O_2$-GCIB is irradiated under the above condition, $O_2$-GCI 19 propagates directly to the structure, as shown in FIG. 4B. Then, as shown in FIG. 4C, when $O_2$-GCI 19 collides with Cu wiring lines 16, due to the collision energy, part of the oxygen of $O_2$-GCI 19 becomes rebound oxygen, part of the Cu surfaces is sputtered, and another part of the oxygen contributes to oxidizing Cu as shown in formula (1) below. Also, the remaining energy from the collision is converted to heat, which further facilitates the oxidation reactions in formula (1). Meanwhile, in acetic acid as the organic compound, reactions between copper oxide and acetic acid are accelerated according to formula (2), producing volatile $Cu(CH_3COO)$ and $H_2O$. Accordingly, copper oxide molecules are eliminated from Cu wiring lines 16. In addition, by continuously supplying an organic compound and irradiating an $O_2$-GCIB, reactions in formulas (1) and (2) continuously occur without applying additional heat upon the structure (substrate). Thus, Cu wiring lines 16 are etched at a high etching rate.

$$2Cu+O \rightarrow Cu_2O \qquad (1)$$

$$Cu_2O+2CH_3COOH \rightarrow 2Cu(CH_3COO)\uparrow + H_2O\uparrow \qquad (2)$$

Reactions in (2) above usually do not occur under room temperature, but they progress when heat is generated from a collision with $O_2$-GCI.

Figure 2E:
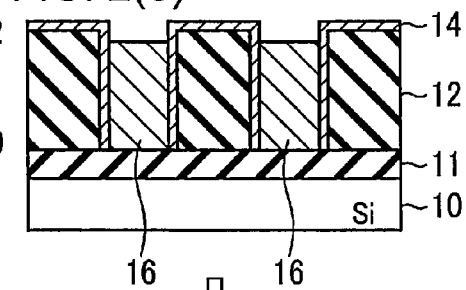

During the above etching, since the $O_2$-GCI 19 propagates straight, the upper portions of Cu wiring lines 16 are anisotropically etched as shown in FIG. 2(e). Thus, Cu atoms are effectively eliminated from wiring corners where electric-field concentration tends to be observed. An approximate etching depth of 30~90 nm is formed.

In the above, $O_2$-GCI 19 is in such a state that a few to tens of thousands of oxygen molecules and oxygen atoms are roughly agglomerated by Van der Waals attraction and in a larger size. Thus, when $O_2$-GCI 19 collides with Cu wiring lines 16, the ions are unlikely to enter the inner part of the wiring lines. Accordingly, the energy from the collision is mainly consumed on the surface portions of Cu wiring lines 16 to cause reactions on the surfaces, and subsequent reactions continue from the surfaces toward the inner part of Cu wiring lines 16 so that the Cu is anisotropically etched to a desired depth. Thus, wiring lines with an excellent shape are obtained and unwanted oxidation is unlikely to occur inside Cu wiring lines 16. In addition, as described above, the etching is processed basically at room temperature, only a small amount of an organic compound suffices, and the etching is processed under a low pressure on the order of $10^{-4}$~$10^{-6}$ Torr. Thus, collisions of $O_2$-GCI and molecules of the organic compound can be ignored, and molecules of the organic compound do not interfere with irradiation of the $O_2$-GCI. Accordingly, a highly efficient reaction rate is achieved. Moreover, since reaction products from reactions in (1) and (2) above are vaporized to be exhausted out, no by-products will be adhered, and complex steps such as removing by-products are not required. In addition, since dry etching does not cause microslits that may occur in wet etching, wiring-line breakage is prevented.

As for the organic compound used in step 3-1, an organic acid is generally used. As for an organic acid, carboxylic acids such as acetic acid used above are preferred (general formula: R—COOH (R is hydrogen, a straight-chain or branched-chain alkyl group or alkenyl group having 1~20 carbon atoms, preferably a methyl, ethyl, propyl, butyl, pentyl or hexyl group)). Carboxylic acids other than acetic acid are formic acid (HCOOH), propionic acid ($CH_3CH_2COOH$), butyric acid ($CH_3(CH_2)_2COOH$), valeric acid ($CH_3(CH_2)_3COOH$) and the like. Among carboxylic acids, formic acid (HCOOH), acetic acid ($CH_3COOH$), and propionic acid ($CH_3CH_2COOH$) are especially preferred. In addition, H(hfac) and the like may be used; also, other organic compounds such as alcohol and aldehyde, which are capable of eliminating Cu through reactions with copper oxide, may be used.

When another organic compound (organic acid) such as formic acid and propionic acid is used instead of acetic acid, the etching progresses through similar reactions to the above formula (2).

Figure 2F:
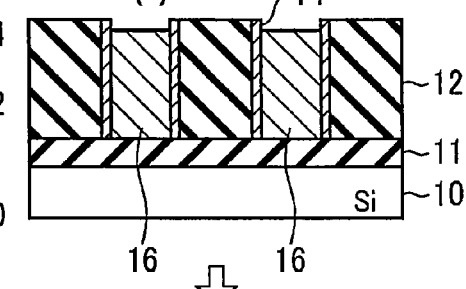
Figure 2G:
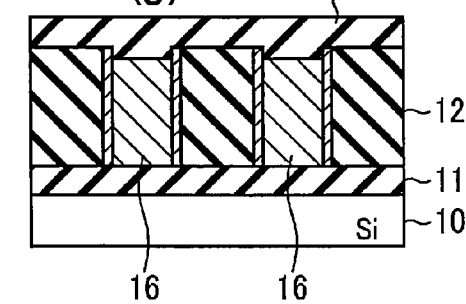

After step 3 described above is finished, barrier film 14 is removed by CMP (step 4, FIG. 2(f)). Then, insulating cap layer 17 made of SiC or SiN is formed on the entire surface (step 5, FIG. 2(g)). Accordingly, a structure is obtained where the surfaces of Cu wiring lines 16 are recessed from the surface of interlayer insulating layer 12 to a desired depth, and Cu atoms are eliminated from wiring corners where electric-field concentration tends to be observed. Thus, even if a leak current is generated, Cu atoms cannot move because no driving force is supplied to allow Cu atoms to ascend, and short-circuiting of Cu wiring lines 16 caused by electromigration of Cu atoms is effectively prevented.

In step 3, since an $O_2$-GCIB is irradiated on the entire surface of the structure, if interlayer insulating layer 12 is formed using a Low-k film that has low damage resistance, the exposed portions of Low-k film may be damaged by the $O_2$-GCIB. However, in the present embodiment, Ta-based barrier film 14 remains on field portions that exclude Cu wiring lines 16 when an $O_2$-GCIB is irradiated. Therefore, only barrier film 14 is damaged from the $O_2$-GCIB irradiation and the results in Low-k interlayer insulating layer 12 show no damage. In addition, even if barrier film 14 is damaged by the $O_2$-GCIB, since it is removed later, no trace of damage will remain.

When the $SiO_2$ film is used to form interlayer insulating layer 12 or $SiO_2$ film is provided on the surface of Low-k film to protect the Low-k film, $SiO_2$ film exists on the surface of interlayer insulating layer 12. Since $SiO_2$ film has relatively high damage resistance to an $O_2$-GCIB, barrier film 14 may be removed before conducting the Cu recessing process so as to allow an $O_2$-GCIB to be irradiated on the surface of interlayer insulating layer 12. In such a case as well, it is also an option to remove barrier film 14 after completion of the Cu recessing process as described above.

According to an embodiment of the present invention, when etching is performed on Cu wiring lines to recess their surfaces from the surface of an interlayer insulating layer, a structure with its barrier film removed is positioned in an organic compound atmosphere having a vacuum state and containing an organic compound, an $O_2$-GCIB is irradiated on the surface of the structure that includes copper wiring surfaces, copper oxide is formed through reactions with the oxygen gas cluster ions in the $O_2$-GCIB, and the copper oxide and the organic compound are reacted to etch the copper wiring lines anisotropically. Thus, oxidation of copper and reactions of copper oxide and the organic compound are efficiently progressed continuously while achieving excellent wiring-line shapes. In addition, since materials produced through such reactions are vaporized and exhausted out, there are no remaining by-products adhered to the surfaces, thus complex steps such as removing by-products are not required. Also, using dry etching, no microslits are formed as is the case with wet etching, and wiring-line breakage is unlikely to occur.

When wet etching is employed for a Cu recessing process, galvanic corrosion may occur between the Cu film and base Ta film to cause microslits. Such microslits reduce the adhered areas of the Cu/Ta interface and become the starting points of electromigration, resulting in wiring-line breakage.

The method for manufacturing a semiconductor device according to an embodiment of the present invention eliminates complex steps, and wiring-line breakage due to microslits is unlikely to occur.

According to an embodiment of the present invention, a method for manufacturing a semiconductor device includes the following: a step for preparing a structure in which an interlayer insulating layer with recessed portions is formed on a substrate, and a copper film is formed to fill in the recessed portions on the interlayer insulating layer with a barrier film disposed in between; a step for forming copper wiring lines in the recessed portions by using chemical mechanical polishing to remove the copper film on the structure down to the interface with the barrier film; a step for etching the copper wiring lines to set their surfaces to be recessed from the surface of the interlayer insulating layer; and a step for removing the barrier film by chemical mechanical polishing. The step for etching the copper wiring lines to set their surfaces to be recessed from the surface of the interlayer insulating layer includes the following: in an organic compound atmosphere having vacuum state and containing an organic compound, positioning the structure with its surface removed down to the barrier film; irradiating an $O_2$-GCIB on the surface of the structure that includes copper wiring line surfaces; using $O_2$-gas cluster ions in the $O_2$-GCIB, oxidizing the copper on the copper wiring line surfaces to make copper oxide, while the copper oxide is reacted with the organic compound so that the copper wiring lines are etched anisotropically.

In the method for manufacturing a semiconductor device according to an embodiment of the present invention, the energy for oxidizing the copper of Cu wiring lines to form copper oxide and for reacting copper oxide and the organic compound is preferred to be supplied from the heat generated when $O_2$-gas cluster ions collide with the copper wiring lines so that etching is performed without applying additional heat upon the substrate. In such a case, since the structure is not heated, molecules of the organic compound tend to be adsorbed on the copper wiring surfaces. Thus, an atmosphere containing an organic compound is set to be vacuum while supplying the organic compound at such an amount that does not interfere the $O_2$-GCIB.

The step for etching the copper wiring lines to set their surfaces to be recessed from the surface of the interlayer insulating layer is preferred to be conducted by continuously irradiating the $O_2$-gas cluster ions on the structure positioned in the atmosphere containing an organic compound so that copper wiring lines are anisotropically etched continuously.

The step for removing the barrier film by chemical mechanical polishing is conducted after the step for etching the copper wiring lines. Such a method is suitable when the interlayer insulating layer is formed using a Low-k film. In addition, the step for removing the barrier film by chemical mechanical polishing may be conducted before the step for etching the copper wiring lines. Such a method is applicable when at least the surface of the interlayer insulating layer is formed with $SiO_2$. However, the step for removing the barrier film by chemical mechanical polishing may also be conducted after the step for etching the copper wiring lines when at least the surface of the interlayer insulating layer is formed with $SiO_2$.

The barrier film is preferred to be made of Ta film, TaN film, or a laminated film of Ta film and TaN film. In addition, after the step for removing the barrier film by chemical mechanical polishing, it is preferred to further include a step for forming an insulating cap layer on the entire surface of the structure.

When the interlayer insulating layer is made of a low damage-resistant Low-k film, the Low-k film may be damaged if it is exposed at the time of an $O_2$-gas ion cluster beam is irradiated. However, damage to the Low-k film is prevented by leaving the barrier film at the time the $O_2$-gas ion cluster beam is irradiated.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a semiconductor device, comprising:
    preparing a structure comprising a substrate, an interlayer insulating layer formed on the substrate and having a recessed portion, a barrier film formed on the interlayer insulating layer, and a copper film formed on the barrier film such that the copper film is filling the recessed portion of the interlayer insulating layer with the barrier film interposed between the interlayer insulating layer and the copper film;
    removing the copper film of the structure by chemical mechanical polishing down to an interface with the barrier film such that a copper wiring is formed in the recessed portion of the interlayer insulating layer;
    etching the copper wiring such that a surface of the copper wiring is recessed from a surface of the interlayer insulating layer; and
    removing the barrier film by chemical mechanical polishing from the surface of the interlayer insulating layer such that the surface of the interlayer insulating layer is exposed,
    wherein the etching of the copper wiring includes positioning in an organic compound atmosphere having a vacuum state and including an organic compound the structure removed down to the barrier film, and irradiating an oxygen gas cluster ion beam on the surface of the copper wiring of the structure such that the copper wiring is anisotropically etched, wherein the etching of the copper includes supplying the organic compound in a supply amount such that the structure is not heated to promote adhesion of molecule of the organic compound to the surface of the copper wiring and that the organic compound atmosphere has a degree of vacuum in which the molecule of the organic compound does not interfere with the oxygen gas cluster ion beam.

2. The method for manufacturing a semiconductor device according to claim 1, wherein the oxygen gas cluster ion beam is irradiated such that oxygen gas cluster ion oxidizes the surface of the copper wiring, copper oxide is generated and the copper oxide and the organic compound are reacted to anisotropically etch the copper wiring.

3. The method for manufacturing a semiconductor device according to claim 2, wherein the oxygen gas cluster ion beam is irradiated such that the copper wiring is etched without applying additional heat upon the substrate, and energy for oxidization of the copper wiring and reaction of the copper oxide and the organic compound is supplied by heat generated by collision of the oxygen gas cluster ion upon the copper wire.

4. The method for manufacturing a semiconductor device according to claim 1, wherein the etching of the copper wiring includes continuously irradiating the oxygen gas cluster ion beam upon the structure in the organic compound atmosphere such that the copper wiring is anisotropically etched continuously.

5. The method for manufacturing a semiconductor device according to claim 1, wherein the removing of the barrier film comprises removing the barrier film by the chemical mechanical polishing after the etching of the copper wiring.

6. The method for manufacturing a semiconductor device according to claim 5, wherein the interlayer insulating layer is a Low-k film.

7. The method for manufacturing a semiconductor device according to claim 1, wherein the removing of the barrier film comprises removing the barrier film by the chemical mechanical polishing prior to the etching of the copper wiring.

8. The method for manufacturing a semiconductor device according to claim 5, wherein the interlayer insulating layer has a surface portion comprising $SiO_2$.

9. The method for manufacturing a semiconductor device according to claim 1, wherein the organic compound is an organic acid.

10. The method for manufacturing a semiconductor device according to claim 9, wherein the organic acid is a carboxylic acid.

11. The method for manufacturing a semiconductor device according to claim 1, wherein the barrier film is one of a Ta film, a TaN film and a laminated film comprising a Ta film and a TaN film.

12. The method for manufacturing a semiconductor device according to claim 1, further comprising:
    forming an insulating cap layer after the removing of the barrier film by the chemical mechanical polishing such that the insulating cap layer is formed on an entire surface of the structure.

13. The method for manufacturing a semiconductor device according to claim 1, further comprising:
    forming an insulating cap layer comprising one of SiC and SiN after the removing of the barrier film by the chemical mechanical polishing such that the insulating cap layer is formed on an entire surface of the structure.

14. The method for manufacturing a semiconductor device according to claim 1, wherein the organic compound is acetic acid.

15. The method for manufacturing a semiconductor device according to claim 1, wherein the organic compound is at least one carboxylic acid selected from the group consisting of acetic acid, formic acid, propionic acid, butyric acid and valeric acid.

16. The method for manufacturing a semiconductor device according to claim 1, wherein the organic compound is at least one compound selected from the group consisting of an organic acid, an alcohol and an aldehyde.

17. The method for manufacturing a semiconductor device according to claim 1, wherein the organic compound is at least one organic acid selected from the group consisting of a carboxylic acid and H(hfac).

18. The method for manufacturing a semiconductor device according to claim 2, wherein the organic compound is at least one compound selected from the group consisting of an organic acid, an alcohol and an aldehyde, and the oxygen gas cluster ion beam is irradiated such that the copper wiring is etched without applying heat upon the substrate, and energy for oxidization of the copper wiring and reaction of the copper oxide and the organic compound is supplied by heat generated by collision of the oxygen gas cluster ion upon the copper wire.

19. The method for manufacturing a semiconductor device according to claim 18, wherein the etching of the copper includes supplying the organic compound in a supply amount such that the structure is not heated to promote adhesion of molecule of the organic compound to the surface of the copper wiring and that the organic compound atmosphere has a degree of vacuum in which the molecule of the organic compound does not interfere with the oxygen gas cluster ion beam.

* * * * *